(12) United States Patent
Masuda

(10) Patent No.: US 6,621,127 B2
(45) Date of Patent: Sep. 16, 2003

(54) SEMICONDUCTOR MEMORY DEVICE WITH MINIATURIZATION IMPROVEMENT

(75) Inventor: Yasuichi Masuda, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/198,961

(22) Filed: Jul. 22, 2002

(65) Prior Publication Data

US 2003/0137011 A1 Jul. 24, 2003

(30) Foreign Application Priority Data

Jan. 24, 2002 (JP) ........................................ 2002-015231

(51) Int. Cl.[7] .............................................. H01L 29/76
(52) U.S. Cl. ........................ 257/368; 257/368; 257/401
(58) Field of Search ................................. 257/368, 390, 257/205, 659, 797, 538, 532, 401; 438/275

(56) References Cited

U.S. PATENT DOCUMENTS 5,396,100 A  * 3/1995 Yamasaki et al. ........... 257/390
5,889,335 A  * 3/1999 Kuroi et al. ................. 257/797
6,153,476 A  * 11/2000 Inaba et al. ................. 438/275
6,166,425 A  * 12/2000 Sakao ........................ 257/538

FOREIGN PATENT DOCUMENTS

JP          405206245 A  *  8/1993    ................. 257/401

* cited by examiner

Primary Examiner—David Nelms
Assistant Examiner—Thinh T. Nguyen
(74) Attorney, Agent, or Firm—Oblon, Spivak, McClelland, Maier & Neustadt, P.C.

(57) ABSTRACT

An isolating insulation film and a P type active region defined by the isolating insulation film are formed on a semiconductor substrate. Then, an access transistor gate electrode, driver transistor gate electrodes, and a dummy gate electrode are formed. The dummy gate electrode is formed to cover part of the active region within a region into which an N type dopant is to be implanted to form $N^+$ source/drain regions. As a result, $N^+$ source/drain regions are not formed under the dummy gate electrode, and the $N^+$ source/drain regions are reduced in width. This reduces the conductance of access transistors, that is, improves a conductance ratio between the driver and access transistors.

4 Claims, 18 Drawing Sheets

F I G . 1 7 A
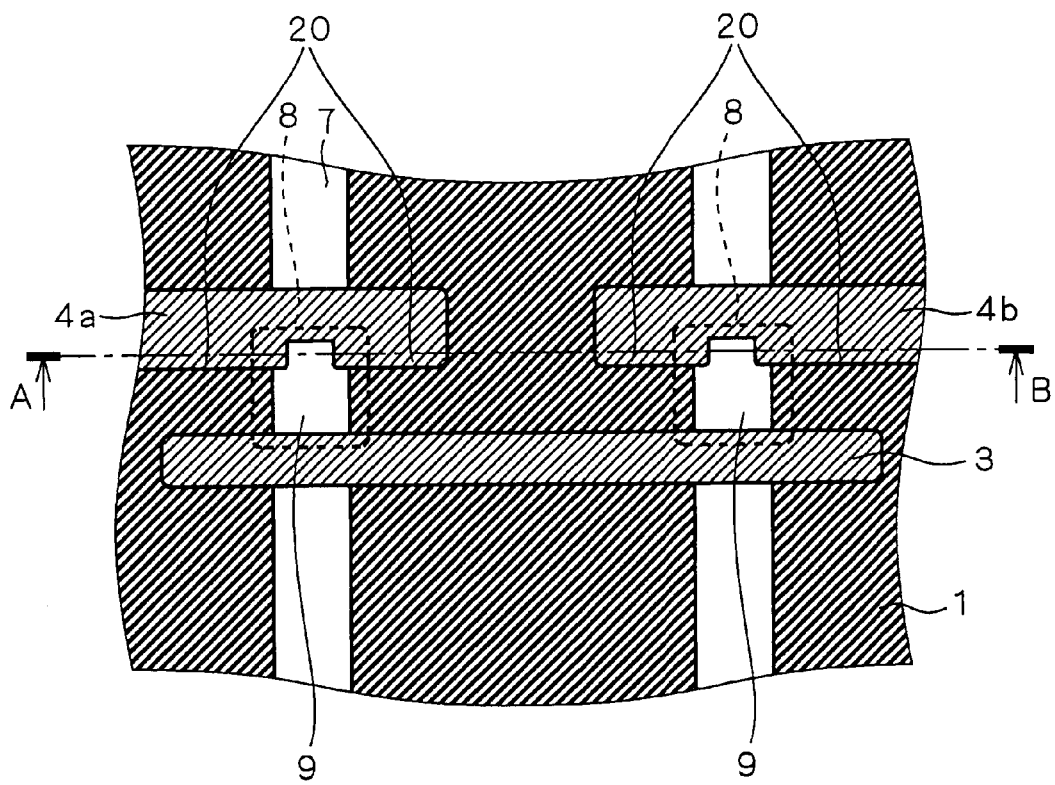
F I G . 1 7 B
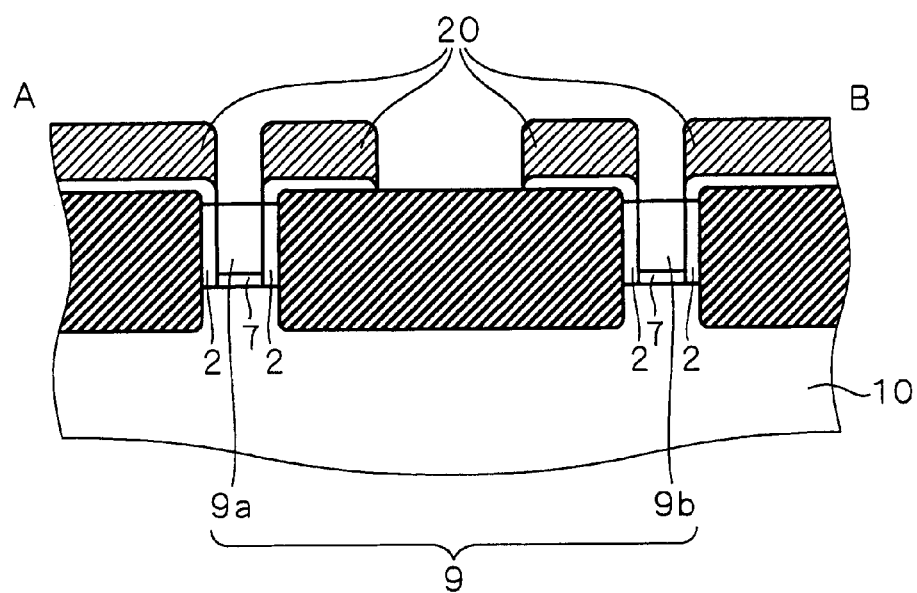

SEMICONDUCTOR MEMORY DEVICE WITH MINIATURIZATION IMPROVEMENT

BACKGROUND OF THE INVENTION

1. Field of the Invention

The present invention relates to a semiconductor memory device and a method of manufacturing the same. More particularly, the invention relates to a technique for improving the stability of operation in an SRAM (Static Random Access Memory).

2. Description of the Background Art

In recent years, the level of integration and functionality of semiconductor devices have been remarkably on the increase, and there has been a demand for size reduction of semiconductor device structures. In the development of semiconductor devices, the size reduction of the semiconductor device structures greatly contributes to the reduction in chip area. Therefore, techniques for the size reduction of the semiconductor device structures are important. This is also true for SRAMs included in semiconductor memory devices without exception, and there has been an expectation for reduction in SRAM memory cell size.

An SRAM cell has transistors (driver transistors) constituting a flip-flop circuit for storing data therein, and transistors (access transistors) for switching. FIGS. 19, 20, 21A and 21B illustrate background art steps of manufacturing an SRAM memory cell portion of a semiconductor memory device. FIGS. 19, 20 and 21A are top views of the memory cell portion, and FIG. 21B is a sectional view taken along the line A–B of FIG. 21A. The background art manufacturing steps of the SRAM memory cell portion will be described with reference to FIGS. 19, 20, 21A and 21B.

Referring first to FIG. 19, an isolating insulation film 101 and a P type active region 102 defined by the isolating insulation film 101 are formed on a semiconductor substrate. An oxide film and an electrode material are deposited on the substrate and are selectively etched to form an access transistor gate electrode 103 and driver transistor gate electrodes 104a and 104b, as shown in FIG. 20. Specifically, access transistors are to be formed in regions 105a and 105b shown in FIG. 20, and driver transistors are to be formed in regions 106a and 106b, respectively. An N type dopant is implanted by using the gate electrodes 103, 104a, 104b as a mask to form $N^-$ source/drain regions 107 in the active region 102 except under the gate electrodes.

Next, a resist pattern having an opening corresponding to a region 108 shown in FIG. 21A is formed on the substrate, and an N type dopant is implanted by using the resist pattern as a mask. As a result, $N^+$ source/drain regions 109 are formed in the active region 102 within the region 108. This forms the access and driver transistors constituting an SRAM cell. In FIG. 21B, the reference numeral 110 designates the semiconductor substrate.

Ensuring the stability of a stored data holding operation and a read operation of an SRAM requires a somewhat high conductance ratio between the driver transistors and the access transistors, that is, the resistance of the access transistors to be held somewhat high. For this purpose, the background art SRAM cell structure as shown in FIG. 21A is adapted such that the $N^-$ regions (or $N^-$ source/drain regions 107) are formed, as shown, between the access transistor gate electrode 103 and the $N^+$ source/drain regions 109 to which a storage node is to be connected and are used as a resistance to ensure the somewhat high conductance ratio. However, advances in size reduction of semiconductor device structures have made it difficult to secure an area for the $N^-$ regions. Thus, an insufficient resistance formed using the $N^-$ regions leads to the degradation of the conductance ratio between the driver transistors and the access transistors.

A possible solution to such a problem is, for example, to reduce the width of the $N^-$ regions between the $N^+$ source/drain regions 109 and the access transistor gate electrode 103 by fine patterning during the formation of the active region 102 to increase the resistance of the $N^-$ regions. In this case, however, there is a danger that the gate width of the access transistors is varied due to misalignment of a mask pattern for the formation of the gate electrodes, which might result in the degradation of the stability of operation quality. In particular, it is very difficult to completely prevent such mask misalignment in the recent manufacture of semiconductor devices advanced in size reduction.

SUMMARY OF THE INVENTION

It is an object of the present invention to provide a semiconductor memory device which can ensure a good conductance ratio between driver and access transistors of an SRAM, require easy manufacturing steps and suppress the influence of mask misalignment, and a method of manufacturing the same.

According to the present invention, the semiconductor memory device includes a plurality of SRAM cells each having a driver transistor constituting a flip-flop circuit and an access transistor for switching. The gate electrode of the driver transistor, the gate electrode of the access transistor, and at least one dummy gate electrode are formed to cover part of an active region wherein source/drain diffusion layers of the access transistor and the driver transistor are formed. The source/drain diffusion layers are formed in only other than the part of the active region covered with the at least one dummy gate electrode.

A change may be made in position and shape of the dummy gate electrode to suppress the current driving capabilities of the access transistor and the driver transistor, thereby controlling a conductance ratio therebetween. Suppressing the current driving capability of the access transistor to suppress the conductance thereof increases the conductance ratio between the driver and access transistors to improve the stability of a stored data holding operation and a reading operation of the SRAM.

The dummy gate electrode may be formed in the same step as the gate electrodes of the driver and access transistors. Thus, there is no increase in the number of manufacturing steps, as compared with the background art method of manufacturing a semiconductor memory device. Additionally, there is no size reduction of a resist pattern for defining the active region and the source/drain diffusion layers. This holds the influence of mask misalignment as large as that of the background art semiconductor memory device.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 17A, 17B, 18A and 18B are views showing modifications of the fourth preferred embodiment.

DESCRIPTION OF THE PREFERRED EMBODIMENTS

<First Preferred Embodiment>

Figure 1A:
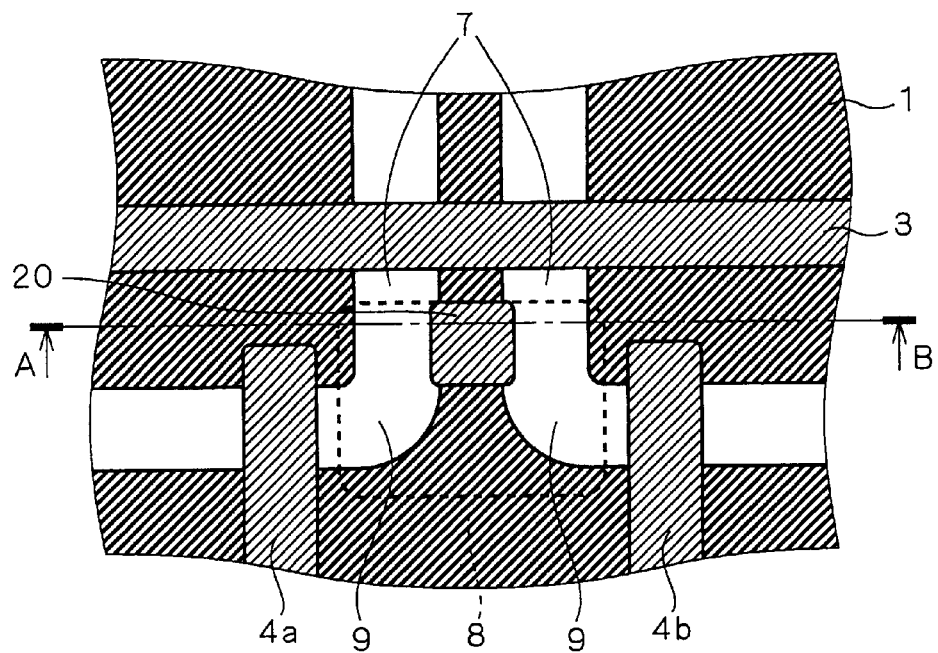
FIGS. 1A and 1B are views showing a construction of an SRAM memory cell portion of a semiconductor memory device according to a first preferred embodiment of the present invention.
Figure 1B:
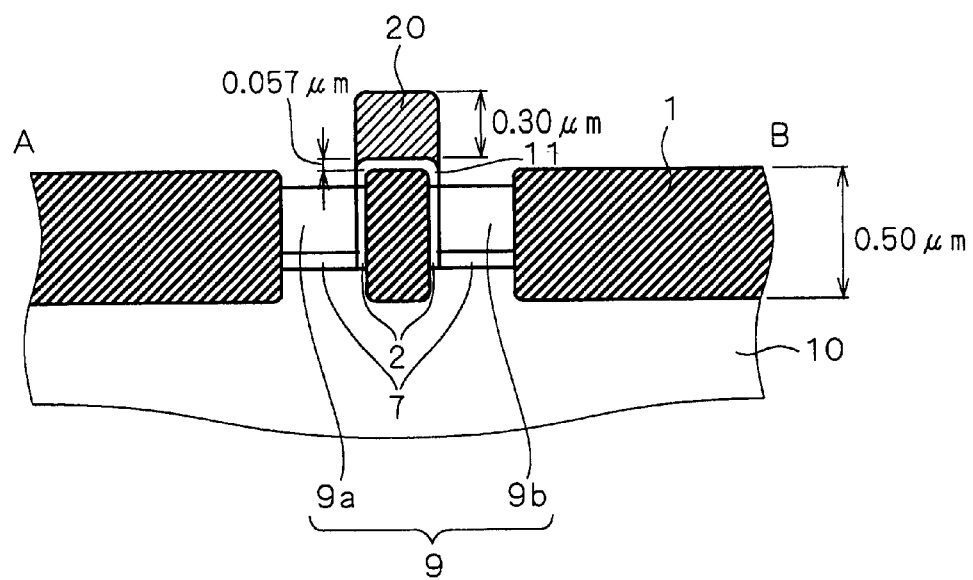

FIGS. 1A and 1B are views showing a construction of an SRAM memory cell portion of a semiconductor memory device according to a first preferred embodiment of the present invention. FIG. 1A is a top view of the memory cell portion, and FIG. 1B is a sectional view taken along the line A–B of FIG. 1A. In FIGS. 1A and 1B, the reference numeral 1 designates an isolating insulation film; 2 designates an active region; 3 designates an access transistor gate electrode; the reference characters 4a and 4b designate driver transistor gate electrodes; 7 designates $N^-$ source/drain regions; 9 (9a and 9b) designates $N^+$ source/drain regions; 20 designates a dummy gate electrode formed to cover part of the active region 2; 10 designates a semiconductor substrate; and 11 designates a gate insulation film.

As shown in FIG. 1B, the $N^-$ source/drain regions 7 and the $N^+$ source/drain regions 9 are not formed in portions of the active region 2 which are covered with the dummy gate electrode 20. In other words, the $N^-$ source/drain regions 7 and the $N^+$ source/drain regions 9 are only other than the portions of the active region 2 which are covered with the dummy gate electrode 20. Such a construction, in which the $N^-$ source/drain regions 7 and the $N^+$ source/drain regions 9 are smaller in width than those of the background art SRAM memory cell, suppresses the current driving capability of access transistors to decrease the conductance thereof. This increases a conductance ratio between driver and access transistors to contribute to an improvement in stability of a stored data holding operation and a reading operation of the SRAM.

Figure 2:
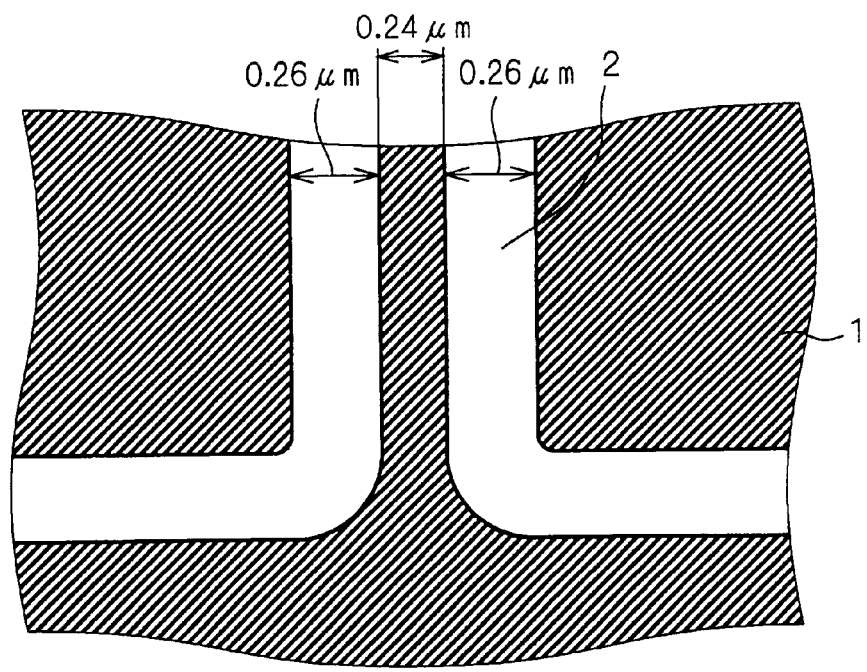
FIGS. 2 and 3 are views for illustrating manufacturing steps of the SRAM memory cell portion of the semiconductor memory device according to the first preferred embodiment.
Figure 3:
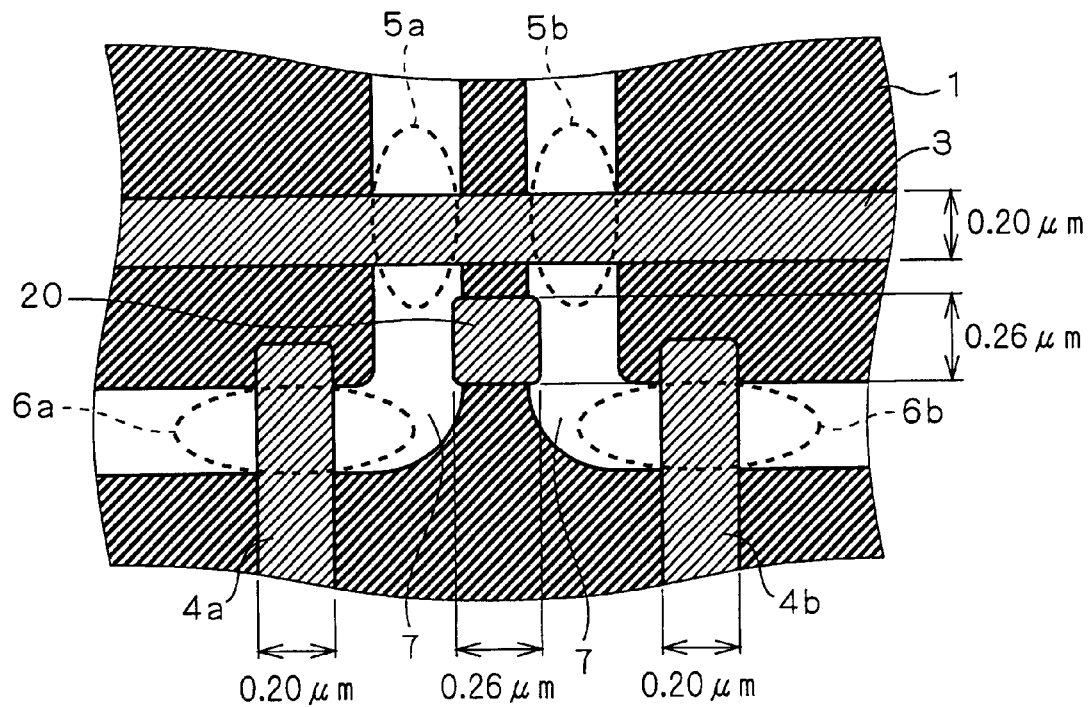

FIGS. 2 and 3 are views for illustrating manufacturing steps of the SRAM memory cell portion of the semiconductor memory device according to the first preferred embodiment. FIGS. 2 and 3 are top views of the memory cell portion. The manufacturing steps of the SRAM memory cell portion according to the first preferred embodiment shown in FIGS. 1A and 1B will be described with reference to FIGS. 2 and 3.

Referring first to FIG. 2, the isolating insulation film 1 and the P type active region 2 defined by the isolating insulation film 1 are formed on a semiconductor substrate. Then, in a similar manner to the background art manufacturing steps of the above-mentioned semiconductor memory device, an oxide film and an electrode material are deposited on the substrate and are selectively etched to form the access transistor gate electrode 3 and the driver transistor gate electrodes 4a and 4b, as shown in FIG. 3. According to the first preferred embodiment, the dummy gate electrode 20 is simultaneously formed in this step. The dummy gate electrode 20 is formed to cover part of the active region 2, as shown in FIG. 3, but is insulated from the active region 2 because of the presence of the gate insulation film 11 therebeneath, like the gate electrodes 3, 4a and 4b. The access transistors are to be formed in regions 5a and 5b shown in FIG. 3, and the driver transistors are to be formed in regions 6a and 6b, respectively.

An N type dopant is implanted by using the gate electrodes 3, 4a, 4b and the dummy gate electrode 20 as a mask to form the $N^-$ source/drain regions 7 in the active region 2 except under the gate electrodes 3, 4a, 4b and the dummy gate electrode 20.

Next, a resist pattern having an opening corresponding to a region 8 shown in FIG. 1A is formed, and an N type dopant is implanted by using the resist pattern as a mask, in a similar manner to the background art manufacturing steps of the semiconductor memory device. As shown in FIG. 1A, the dummy gate electrode 20 is formed to cover part of the active region 2 within the region 8 in the step of forming the same.

As a result, the $N^+$ source/drain regions 9 are formed in the active region 2 within the region 8 except under the dummy gate electrode 20. This forms the access and driver transistors constituting an SRAM cell. FIG. 1B is a sectional view after the $N^+$ source/drain regions 9 are formed. It will be found from FIG. 1B that the $N^+$ source/drain regions 9 are reduced in width as indicated by 9a and 9b in FIG. 1B since the $N^+$ source/drain regions 9 are absent under the dummy gate electrode 20.

In the semiconductor memory device according to the first preferred embodiment, the dummy gate electrode 20 is formed to cover part of the region 8 into which the N type dopant is implanted to form the $N^+$ source/drain regions 9 in the active region 2, and the $N^+$ source/drain regions 9 and the $N^-$ source/drain regions 7 are not formed under the dummy gate electrode 20. Such a construction suppresses the current driving capability of the access transistors to decrease the conductance thereof. This increases the conductance ratio between the driver and access transistors to contribute to the improvement in stability of the stored data holding operation and reading operation of the SRAM.

It will be found from the above that the method according to the first preferred embodiment involves no increase in the number of manufacturing steps, as compared with the background art method of manufacturing the semiconductor memory device. Additionally, the method according to the first preferred embodiment involves no size reduction of the resist pattern for defining, for example, the active region 2 and the region 8 into which the N type dopant is implanted to form the $N^+$ source/drain regions 9. This holds the influence of mask misalignment of the device according to the first preferred embodiment as large as that of the background art semiconductor memory device.

The position and shape of the dummy gate electrode 20 are not limited to those illustrated in FIGS. 1A, 1B and 3. A change may be made in the position and shape of the dummy gate electrode 20 to produce any change in resistance between the sources of the access transistors and a storage node, that is, change in the current driving capability and the conductance of the access transistors.

The dummy gate electrode 20 may be positioned to cover future source/drain regions of the driver transistors, thereby changing the current driving capability and the conductance of the driver transistors. Thus, any conductance ratio may be obtained without influences upon the gate length and the gate width of the access and driver transistors.

The dummy gate electrode 20 is shown in FIGS. 1A and 3 as disposed independently of the access transistor gate electrode 3 and the driver transistor gate electrodes 4a, 4b. Instead, the dummy gate electrode 20 may be connected to the access transistor gate electrode 3 or the driver transistor gate electrodes 4a, 4b. This reduces space on the substrate for the formation of the dummy gate electrode 20 to contribute to the size reduction of the semiconductor memory device. A plurality of dummy gate electrodes 20 may be provided.

Figure 4A:
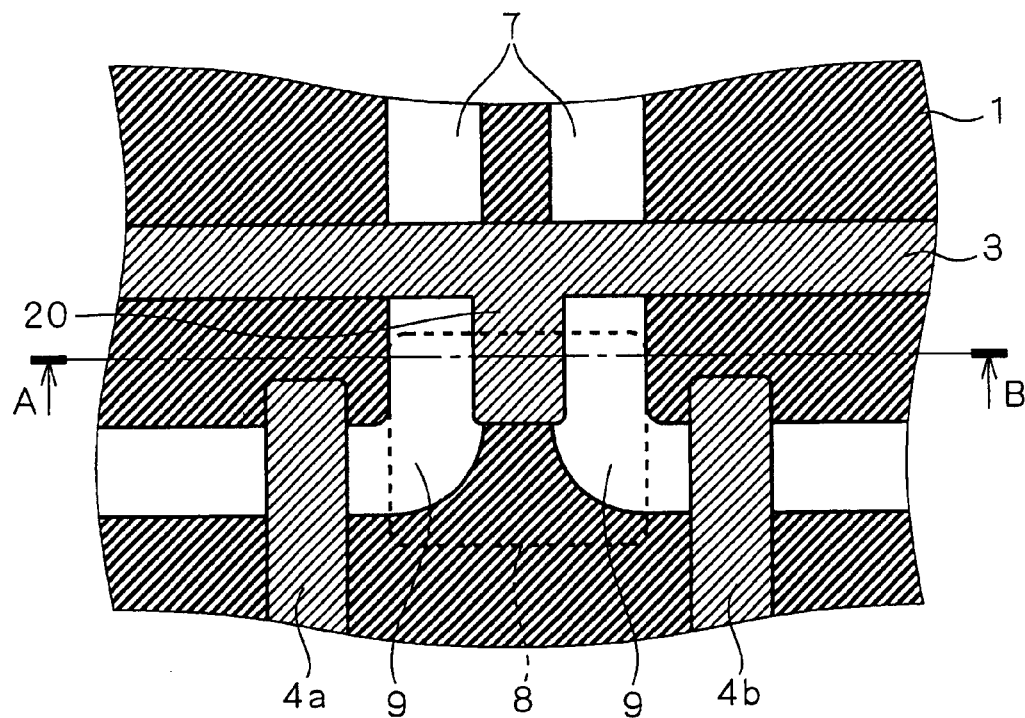
FIGS. 4A, 4B, 5A and 5B are views showing modifications of the first preferred embodiment.
Figure 4B:
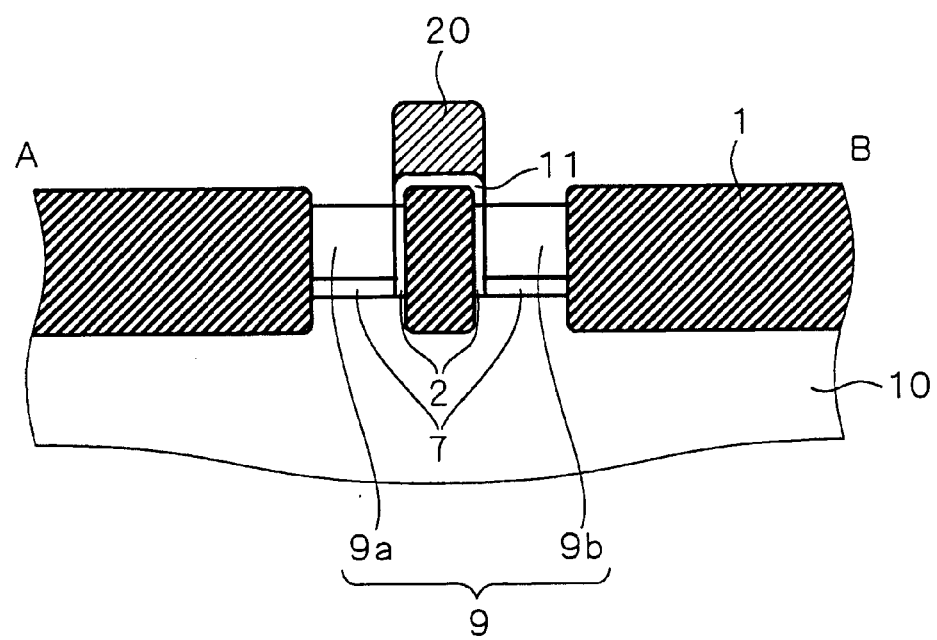
Figure 5A:
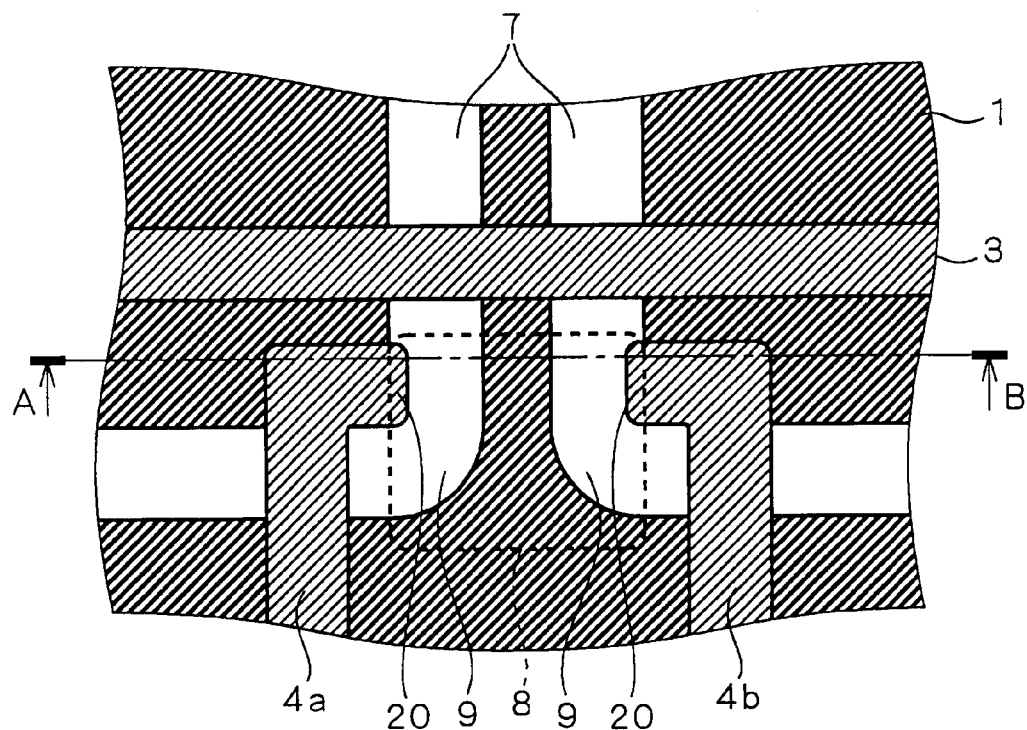
Figure 5B:
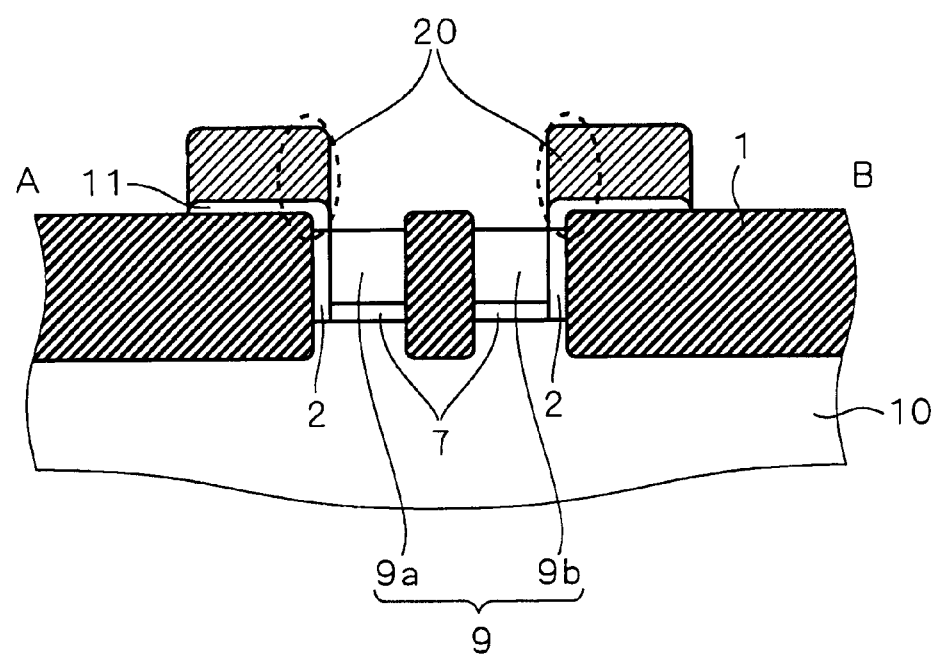

Examples of such modifications are shown in FIGS. 4A, 4B, 5A and 5B. Elements similar in function to those of FIGS. 1A and 1B are designated by the same reference numerals and characters and will not be described in detail. FIGS. 4A and 5A are top views, and FIGS. 4B and 5B are sectional views taken along the lines A–B of FIGS. 4A and 5A, respectively. It will be found from FIGS. 4B and 5B that the $N^+$ source/drain regions 9 and the $N^-$ source/drain regions 7 are not formed under the dummy gate electrode(s) 20. A change may be made in the position and shape of the dummy gate electrode(s) 20 to attain any conductance ratio.

<Second Preferred Embodiment>

Figure 6A:
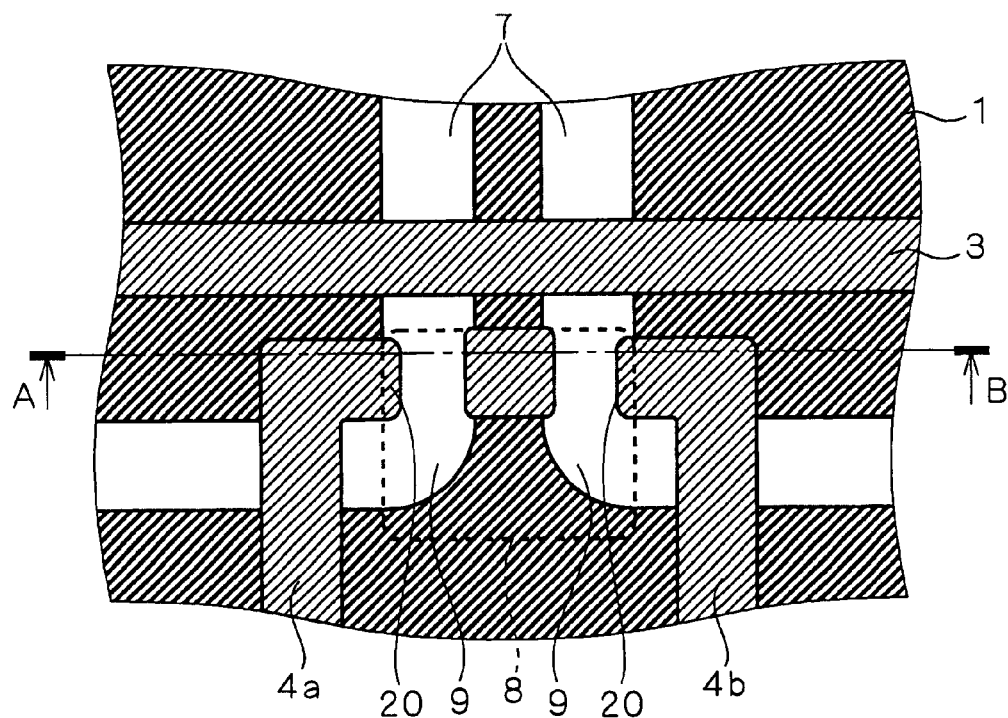
FIGS. 6A and 6B are views showing a construction of the SRAM memory cell portion of the semiconductor memory device according to a second preferred embodiment of the present invention.
Figure 6B:
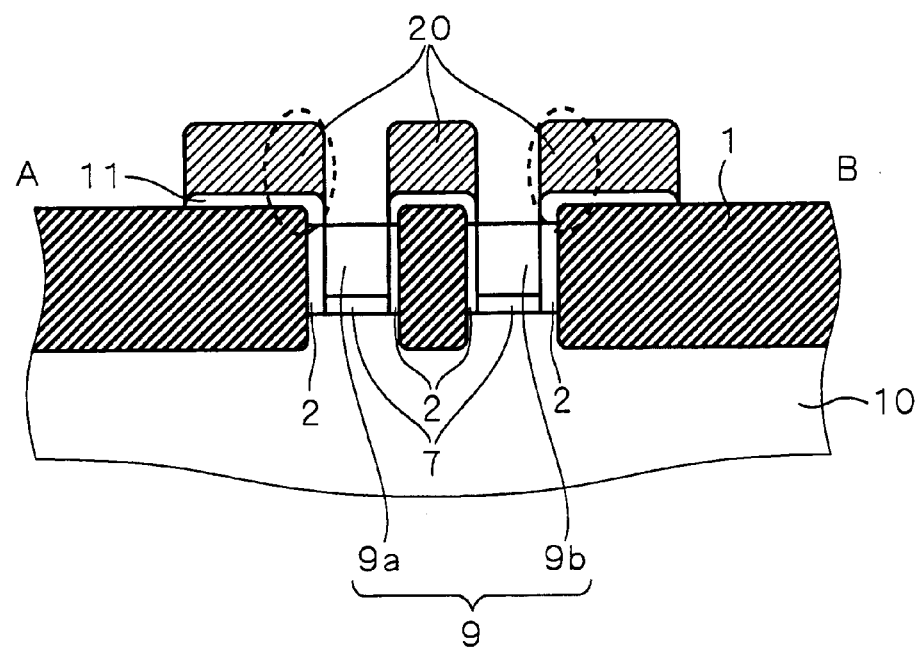

FIGS. 6A and 6B are views showing a construction of the SRAM memory cell portion of the semiconductor memory device according to a second preferred embodiment of the present invention. FIG. 6A is a top view of the memory cell portion, and FIG. 6B is a sectional view taken along the line A–B of FIG. 6A. Elements similar in function to those of FIGS. 1A and 1B are designated by the same reference numerals and characters and will not be described in detail.

As in the first preferred embodiment, the dummy gate electrodes 20 are formed which cover part of the active region 2 within the region 8 into which the N type dopant is implanted to form the $N^+$ source/drain regions 9, when the access transistor gate electrode 3 and the driver transistor gate electrodes 4a and 4b are formed. According to the second preferred embodiment, as shown in FIG. 6A, the dummy gate electrodes 20 are disposed laterally (in the X direction) on opposite sides of the active region 2 as viewed in plan, that is, over the opposed sides of the active region 2. As a result, the $N^+$ source/drain regions 9 and the $N^-$ source/drain regions 7 are formed in the active region 2 except under the gate electrodes, as shown in FIG. 6B, and the $N^+$ source/drain regions 9 are reduced in width. This provides effects similar to those of the first preferred embodiment. As in the first preferred embodiment, it is obvious that the manufacturing method according to the second preferred embodiment involves no increase in the number of manufacturing steps, as compared with the background art method of manufacturing the semiconductor memory device.

If the position of the dummy gate electrode 20 according to the first preferred embodiment is shifted in the X direction because of mask misalignment in the X direction in the step of forming the gate electrodes 3, 4a and 4b, there arises a difference in width, for example, between the two $N^+$ source/drain regions 9a and 9b shown in FIG. 1B. If the mask misalignment occurs in the rightward direction, the $N^+$ source/drain region 9a has a greater width whereas the $N^+$ source/drain region 9b has a smaller width. This gives rise to an imbalance in conductance between the two access transistors of the SRAM cell to result in the degradation of the stability of the SRAM operation.

According to the second preferred embodiment, however, the dummy gate electrodes 20 are disposed in the X direction on the opposite sides of the active region 2 as viewed in plan. Thus, if the mask misalignment occurs in the X direction during the formation of the gate electrodes 3, 4a, 4b and the dummy gate electrodes 20, the widths of the two $N^+$ source/drain regions 9a and 9b shown in FIG. 6B are held constant. This prevents the imbalance in conductance between the two access transistors of the SRAM cell to suppress the degradation of the stability of the SRAM operation.

The position and shape of the dummy gate electrodes 20 according to the second preferred embodiment are not limited to those shown in FIGS. 6A and 6B. A change may be made in the position and shape of the dummy gate electrodes 20 to produce any change in the resistance between the sources of the access transistors and the storage node, that is, change in the current driving capability and the conductance of the access transistors.

The dummy gate electrodes 20 may be positioned to cover the future source/drain regions of the driver transistors, thereby changing the current driving capability and the conductance of the driver transistors. Thus, any conductance ratio may be obtained without influences upon the gate length and the gate width of the access and driver transistors.

The dummy gate electrodes 20 may be connected to the access transistor gate electrode 3 or the driver transistor gate electrodes 4a, 4b. This reduces space on the substrate for the formation of the dummy gate electrodes 20 to contribute to the size reduction of the semiconductor memory device.

Figure 7A:
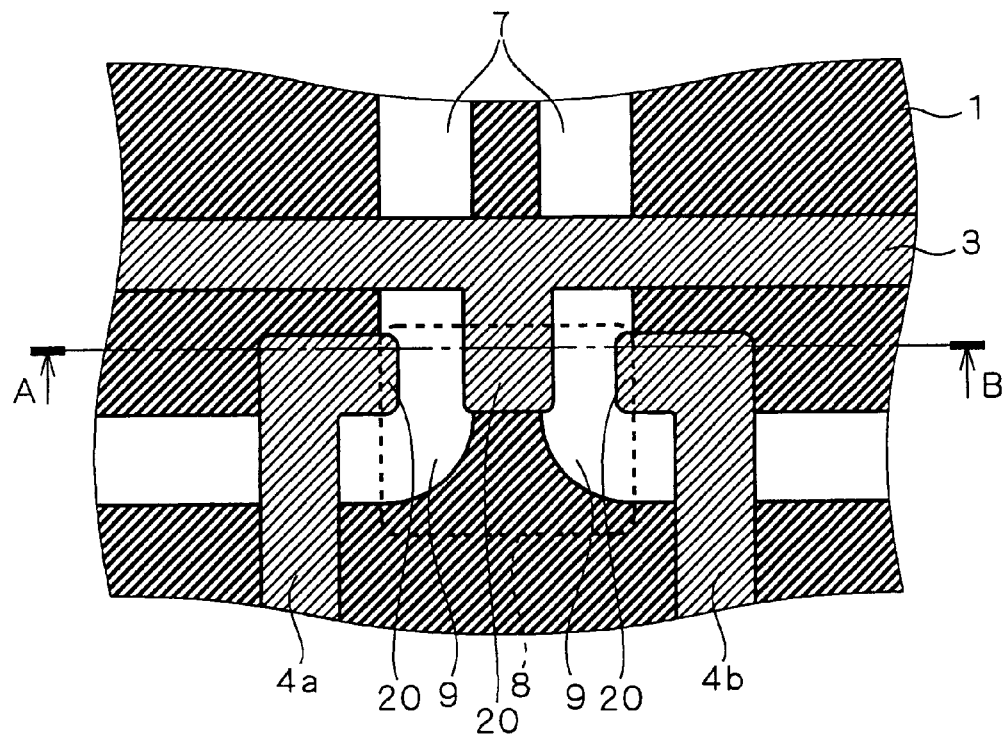
FIGS. 7A and 7B are views showing a modification of the second preferred embodiment.
Figure 7B:
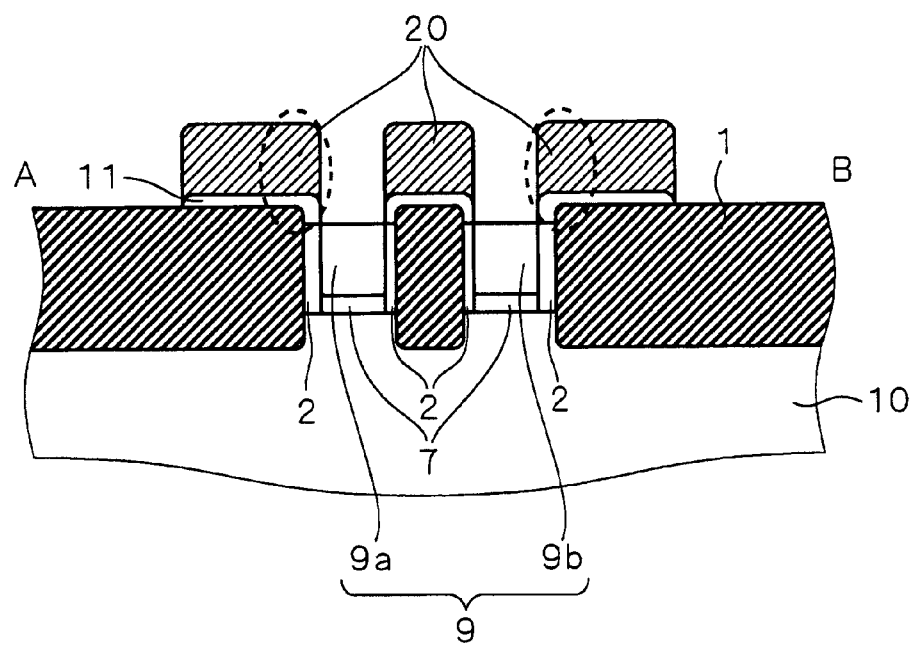

An example of such a modification is shown in FIGS. 7A and 7B. Elements similar in function to those of FIGS. 1A and 1B are designated by the same reference numerals and characters. FIG. 7A is a top view, and FIG. 7B is a sectional view taken along the line A–B of FIG. 7A. It will be found from FIG. 7B that the $N^+$ source/drain regions 9 and the $N^-$ source/drain regions 7 are not formed under the dummy gate electrodes 20. A change may be made in the position and shape of the dummy gate electrodes 20 to attain any conductance ratio.

<Third Preferred Embodiment>

In the SRAM cell structures according to the first and second preferred embodiments, the access transistors and the driver transistors are disposed at right angles to each other. The present invention, however, is easily applicable to other SRAM cell structures.

Figure 8:
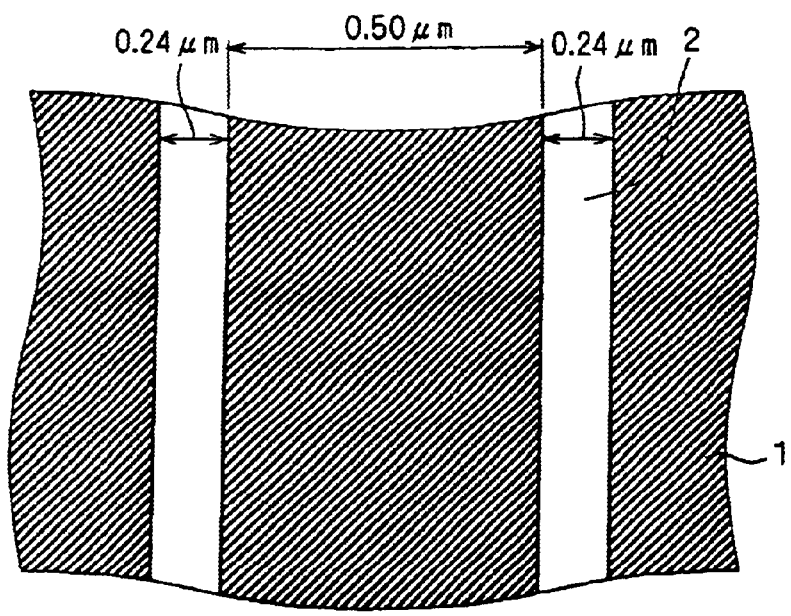
FIGS. 8, 9, 10A and 10B are views for illustrating manufacturing steps of the SRAM memory cell portion of the semiconductor memory device according to a third preferred embodiment of the present invention.
Figure 9:
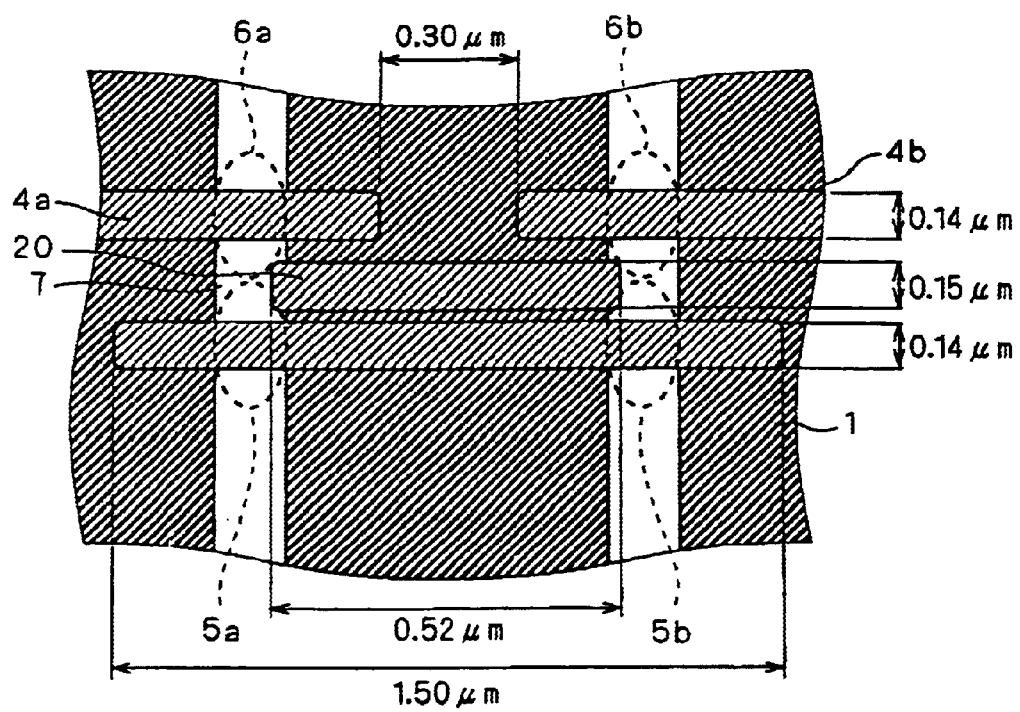
Figure 10A:
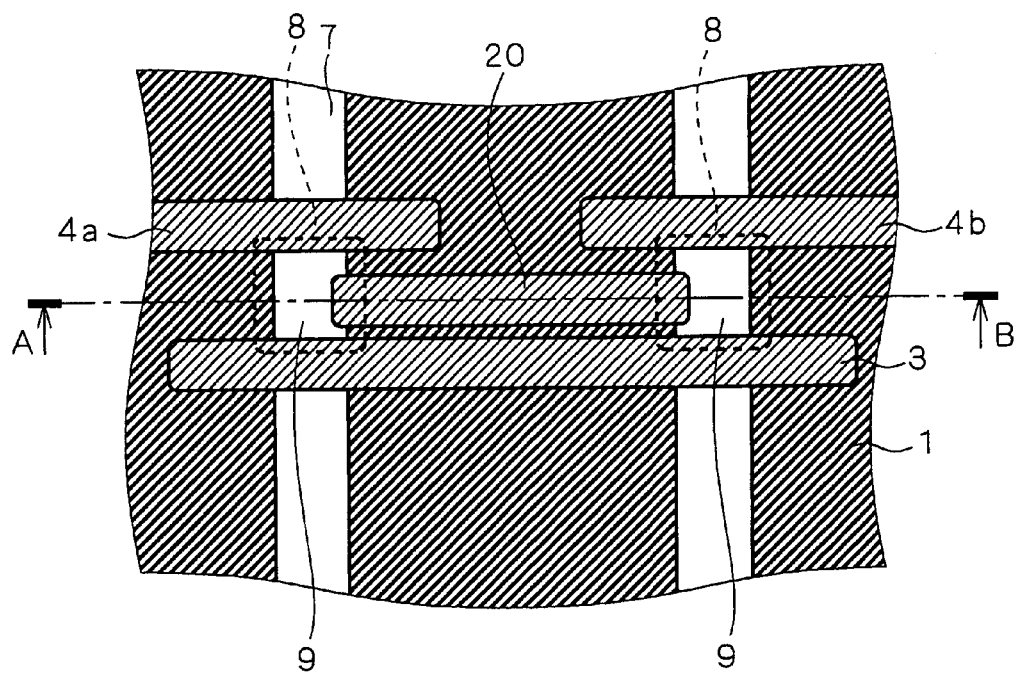
Figure 10B:
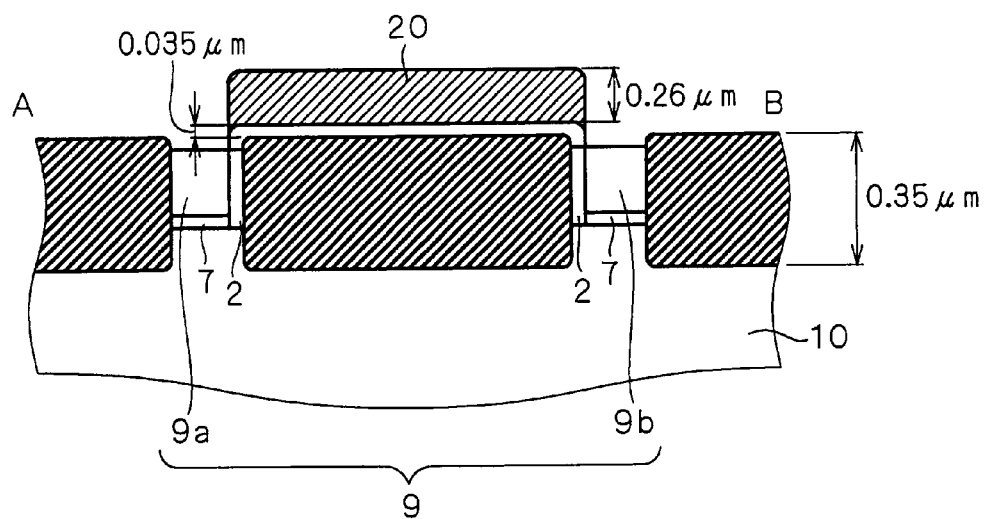

FIGS. 8, 9, 10A and 10B show the manufacturing steps when the present invention is applied to an SRAM cell structure in which the access transistors and the driver transistors are disposed in the same orientation. FIGS. 8, 9 and 10A are top views of the memory cell portion, and FIG. 10B is a sectional view taken along the line A–B of FIG. 10A. The manufacturing steps of the SRAM memory cell portion according to a third preferred embodiment of the present invention will be described with reference to FIGS. 8, 9, 10A and 10B. Elements similar in function to those of FIGS. 1A, 1B, 2 and 3 are designated by the same reference numerals and characters.

Referring first to FIG. 8, the isolating insulation film 1 and the P type active region 2 defined by the isolating insulation film 1 are formed on a semiconductor substrate. Then, as in the first preferred embodiment, an oxide film and an electrode material are deposited on the substrate and are selectively etched to form the access transistor gate electrode 3, the driver transistor gate electrodes 4a and 4b and the dummy gate electrode 20, as shown in FIG. 9. The dummy gate electrode 20 is formed to cover part of the active region 2, as shown in FIG. 9. The access transistors are to be formed in the regions 5a and 5b shown in FIG. 9, and the driver transistors are to be formed in the regions 6a and 6b, respectively.

An N type dopant is implanted by using the gate electrodes 3, 4a, 4b and the dummy gate electrode 20 as a mask to form the N⁻ source/drain regions 7 in the active region 2 except under the gate electrodes 3, 4a, 4b and the dummy gate electrode 20.

Next, a resist pattern having openings corresponding to the regions 8 into which an N type dopant is to be implanted to form the N⁺ source/drain regions 9 shown in FIG. 10A is formed, and an N type dopant is implanted by using the resist pattern as a mask to form the N⁺ source/drain regions 9. Since the dummy gate electrode 20 is formed to cover part of the active region 2 within the regions 8 as shown in FIG. 10A, the N⁺ source/drain regions 9 are not formed under the dummy gate electrode 20 within the regions 8. FIG. 10B is a sectional view after the N⁺ source/drain regions 9 are formed. The N⁺ source/drain regions 9 are reduced in width, as indicated by 9a and 9b.

Such a construction suppresses the current driving capability of the access transistors to decrease the conductance thereof. This increases the conductance ratio between the driver and access transistors to contribute to the improvement in stability of the stored data holding operation and reading operation of the SRAM.

It will be found from the above that the method according to the third preferred embodiment involves no increase in the number of manufacturing steps, as compared with the background art method of manufacturing the semiconductor memory device. Additionally, the method according to the third preferred embodiment involves no size reduction of the resist pattern for defining, for example, the active region 2 and the regions 8 into which the N type dopant is implanted to form the N⁺ source/drain regions 9. This holds the influence of mask misalignment of the device according to the third preferred embodiment as large as that of the background art semiconductor memory device.

As stated above, the present invention is easily applicable to the structure in which the access and driver transistors are disposed in the same orientation. The third preferred embodiment produces effects similar to those of the first preferred embodiment.

The position and shape of the dummy gate electrode 20 are not limited to those illustrated in FIGS. 9, 10A and 10B. A change may be made in the position and shape of the dummy gate electrode 20 to produce any change in the resistance between the sources of the access transistors and the storage node, that is, change in the current driving capability and the conductance of the access transistors.

The dummy gate electrode 20 may be positioned to cover the future source/drain regions of the driver transistors, thereby changing the current driving capability and the conductance of the driver transistors. Thus, any conductance ratio may be obtained without influences upon the gate length and the gate width of the access and driver transistors.

Figure 11A:
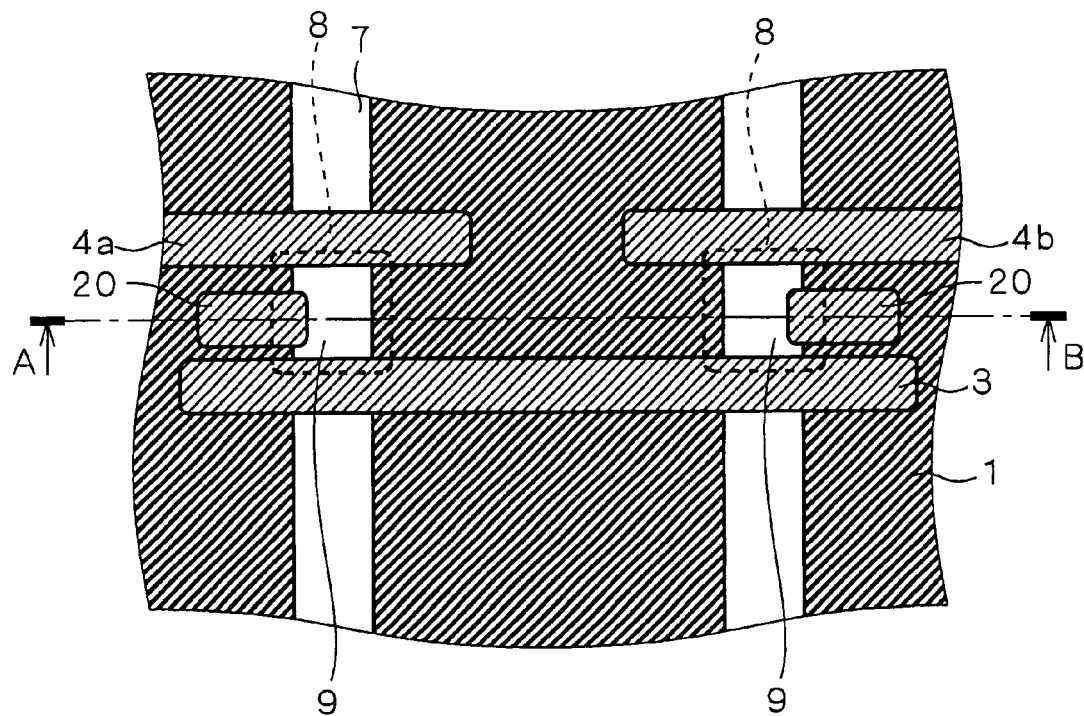
FIGS. 11A, 11B, 12A, 12B, 13A, 13B, 14A, 14B, 15A and 15B are views showing modifications of the third preferred embodiment.
Figure 11B:
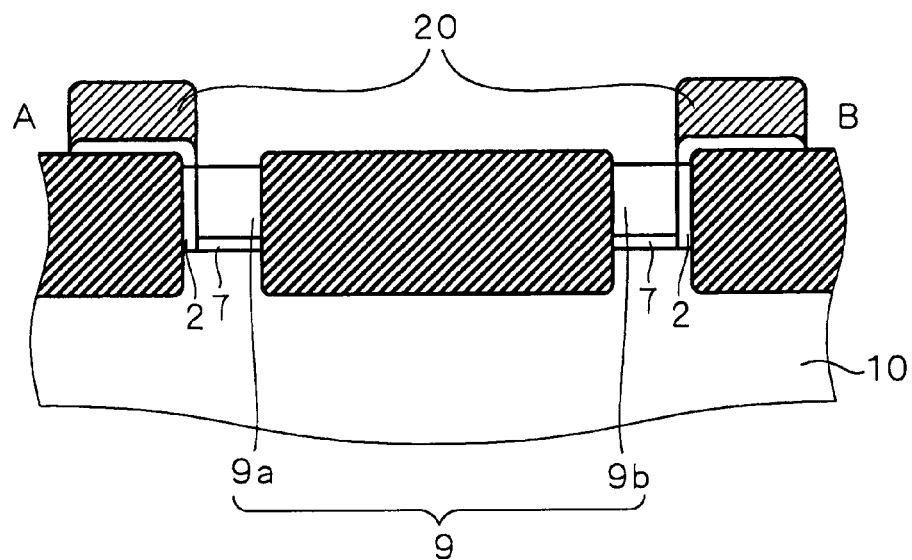
Figure 12A:
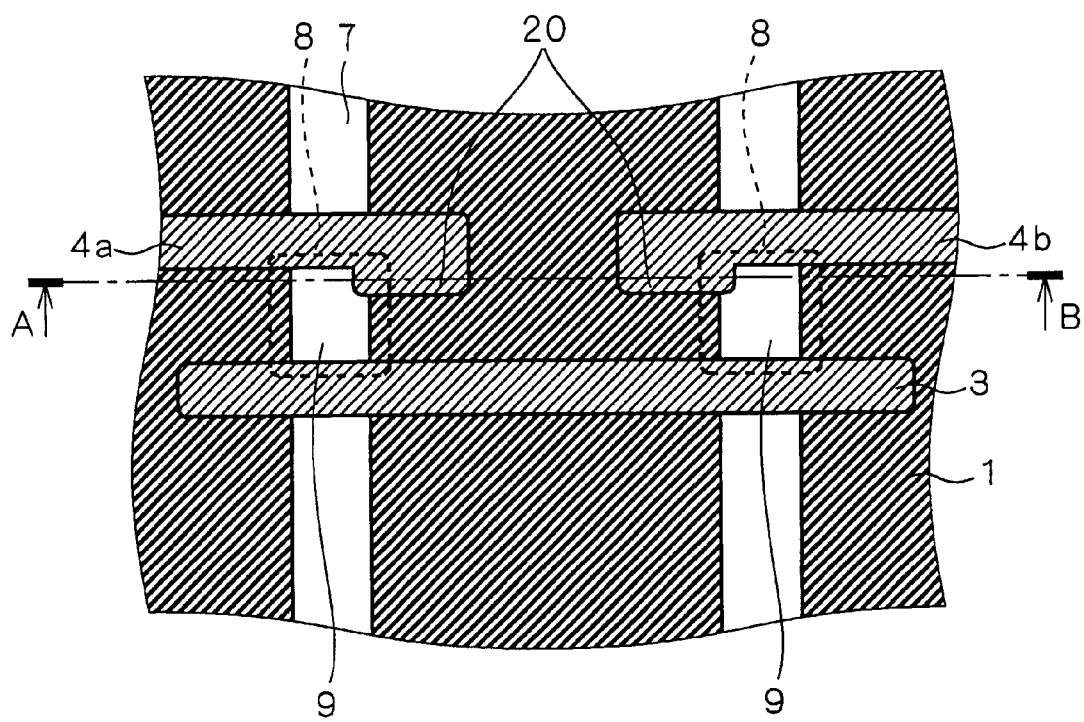
Figure 12B:
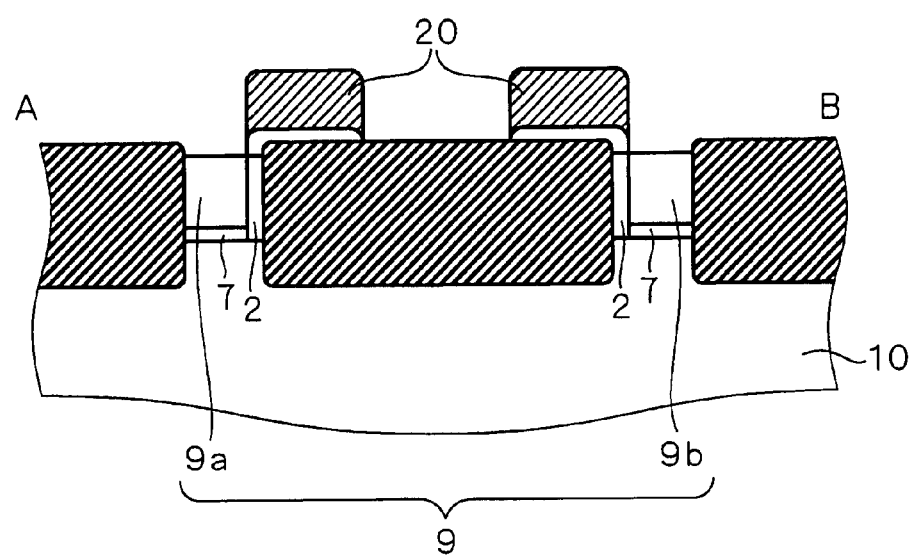
Figure 13A:
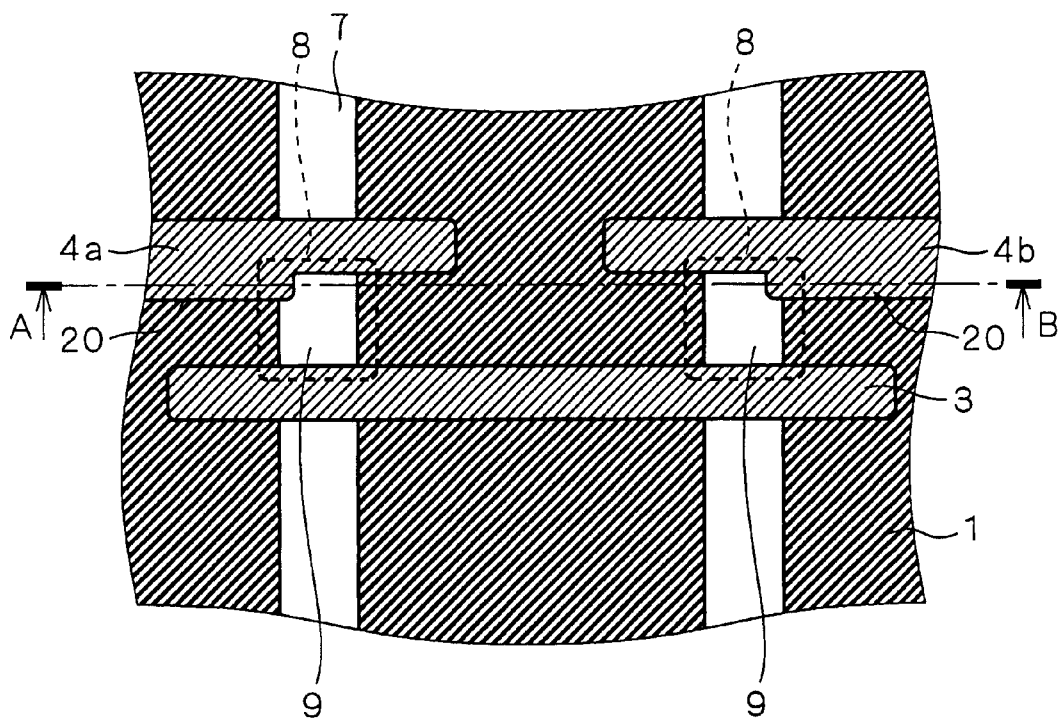
Figure 13B:
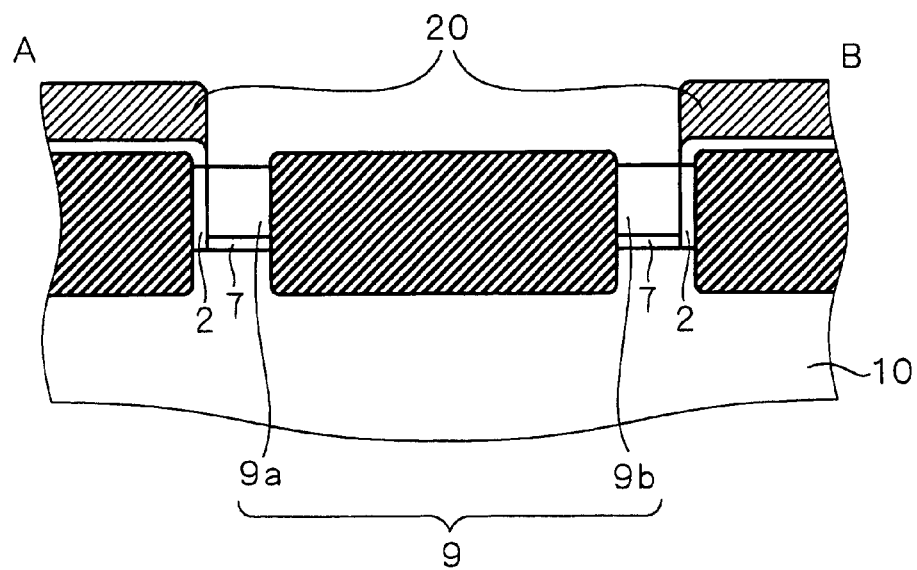
Figure 14A:
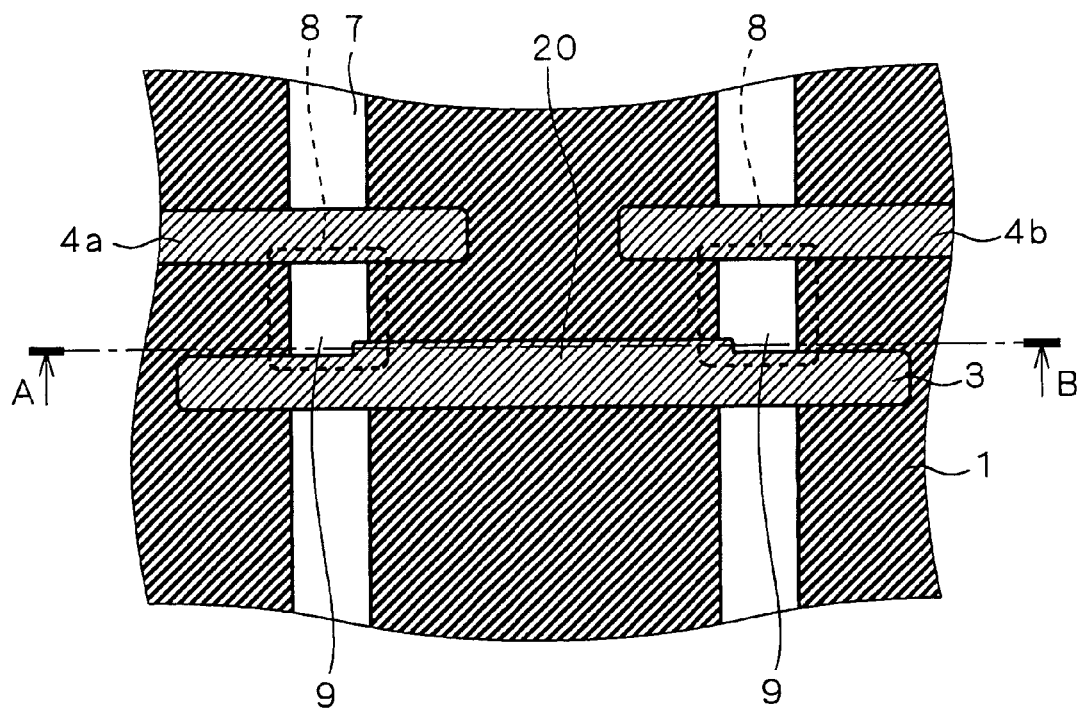
Figure 14B:
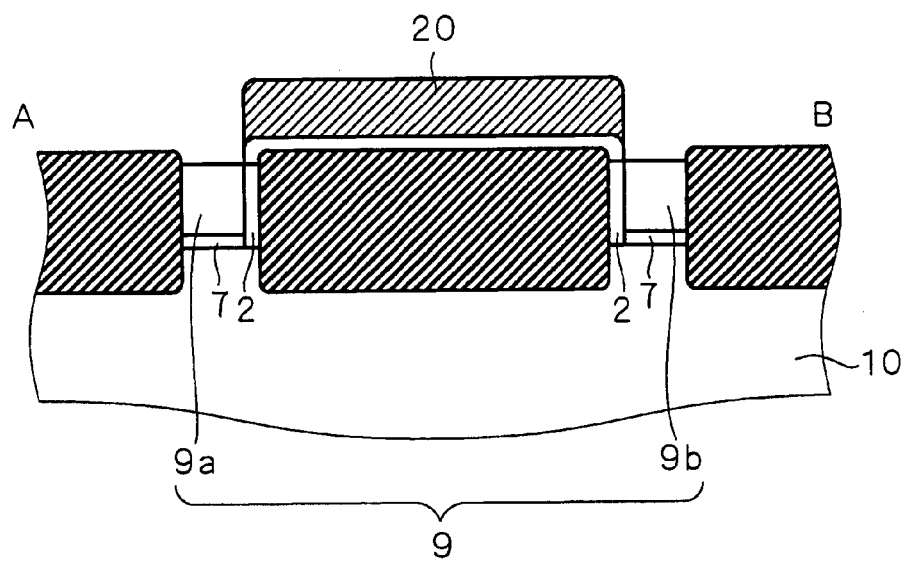
Figure 15A:
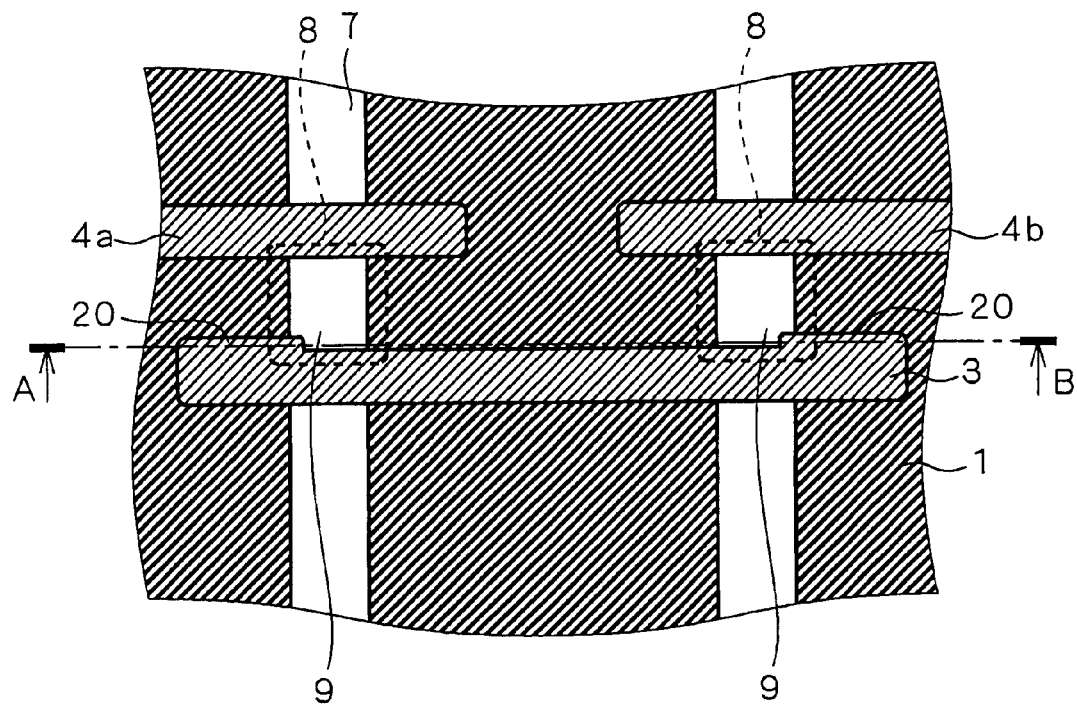
Figure 15B:
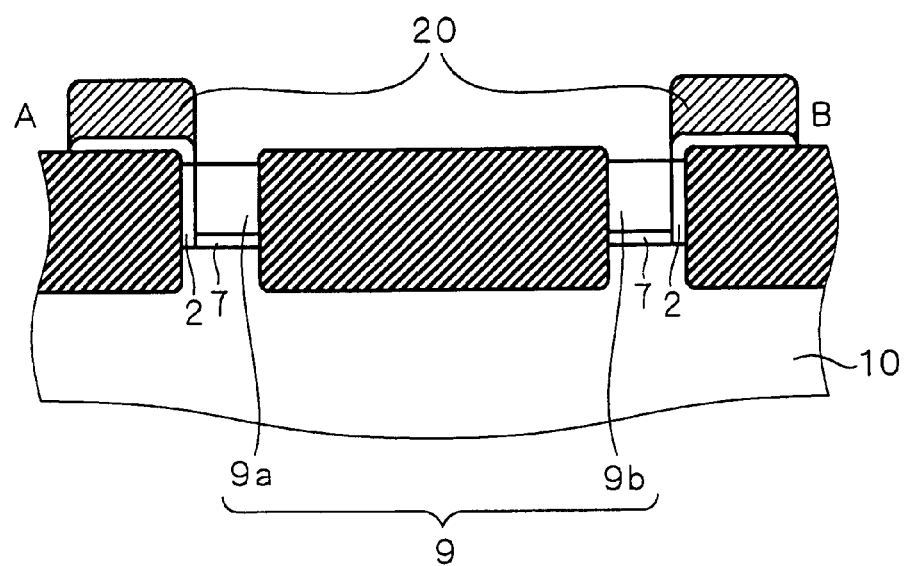

A plurality of dummy gate electrodes 20 may be provided, for example, as shown in FIGS. 11A and 11B. FIG. 11A is a top view, and FIG. 11B is a sectional view taken along the line A–B of FIG. 11A. Also in this case, the N⁺ source/drain regions 9 and the N⁻ source/drain regions 7 are not formed under the dummy gate electrodes 20, and effects similar to those in the case shown in FIGS. 10A and 10B are produced.

The dummy gate electrode(s) 20 may be connected to the access transistor gate electrode 3 or the driver transistor gate electrodes 4a, 4b. This reduces space on the substrate for the formation of the dummy gate electrode(s) 20 to contribute to the size reduction of the semiconductor memory device.

Examples of such modifications are shown in FIGS. 12A, 12B, 13A, 13B, 14A, 14B, 15A and 15B. Elements similar in function to those of FIGS. 10A and 10B are designated by the same reference numerals and characters. FIGS. 12A, 13A, 14A and 15A are top views, and FIGS. 12B, 13B, 14B and 15B are sectional views taken along the lines A–B of FIGS. 12A, 13A, 14A and 15A, respectively. It will be found from FIGS. 12B, 13B, 14B and 15B that the N⁺ source/drain regions 9 and the N⁻ source/drain regions 7 are not formed under the dummy gate electrode(s) 20. A change may be made in the position and shape of the dummy gate electrode(s) 20 to attain any conductance ratio.

<Fourth Preferred Embodiment>

Figure 16A:
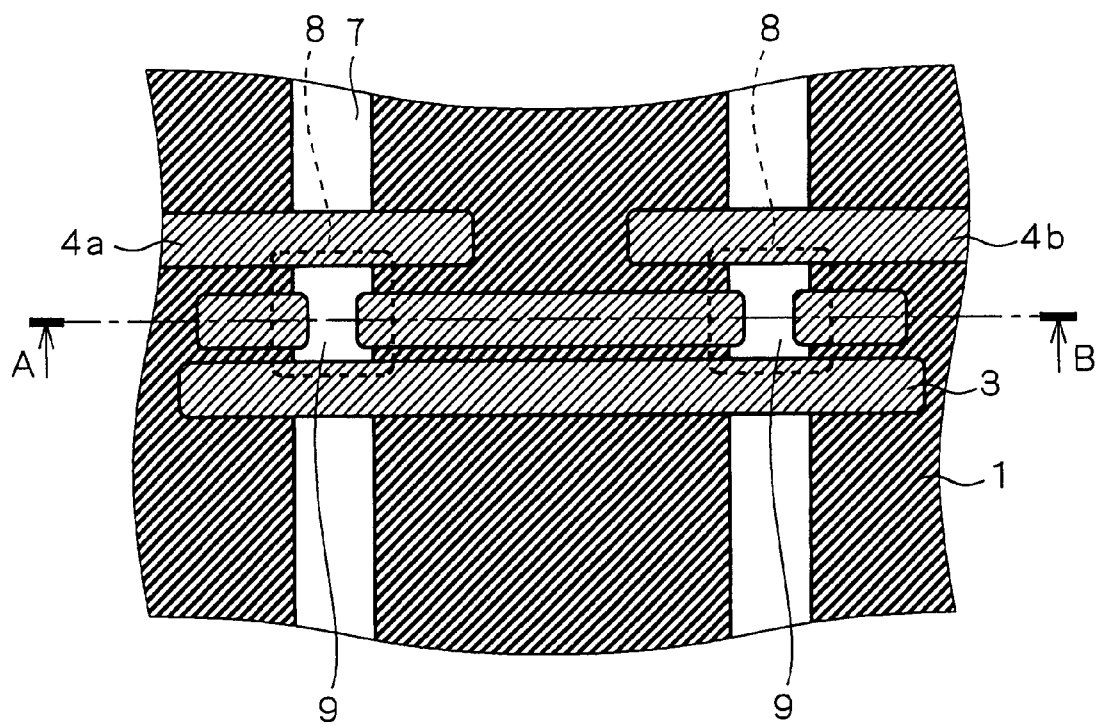
FIGS. 16A and 16B are views showing a construction of the SRAM memory cell portion of the semiconductor memory device according to a fourth preferred embodiment of the present invention.
Figure 16B:
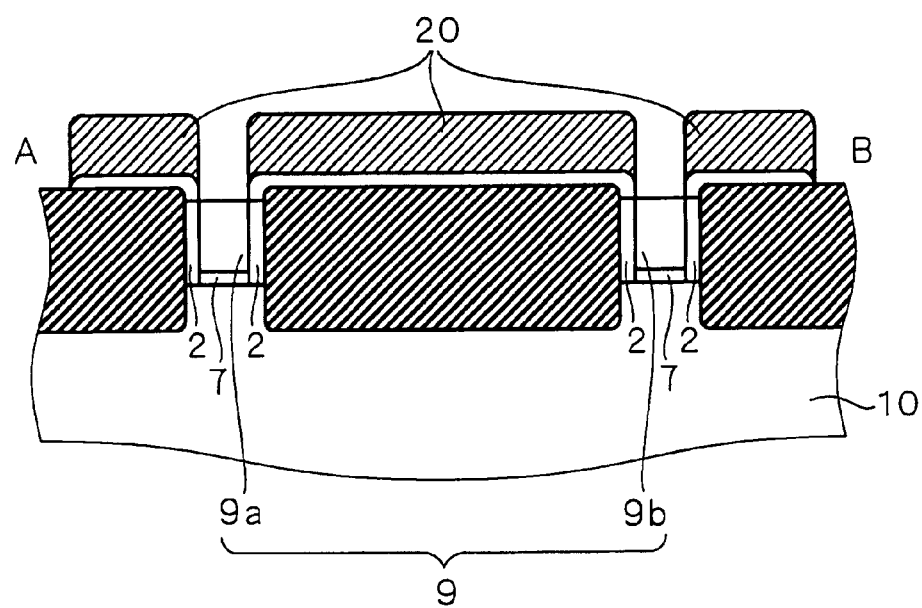

FIGS. 16A and 16B are views showing a construction of the SRAM memory cell portion of the semiconductor memory device according to a fourth preferred embodiment of the present invention. FIG. 16A is a top view of the memory cell portion, and FIG. 16B is a sectional view taken along the line A–B of FIG. 16A. Elements similar in function to those of FIGS. 1A and 1B are designated by the same reference numerals and characters and will not be described in detail.

According to the fourth preferred embodiment, in the structure in which the access and driver transistors are disposed in the same orientation as in the third preferred embodiment, the dummy gate electrodes 20 are disposed laterally (in the X direction) on opposite sides of the active region 2 as viewed in plan, that is, over the opposed sides of the active region 2. As a result, the N⁺ source/drain regions 9 and the N⁻ source/drain regions 7 are formed in the active region 2 except under the gate electrodes, as shown in FIG. 16B, and the N⁺ source/drain regions 9 are reduced in width. This provides effects similar to those of the third preferred embodiment. As in the third preferred embodiment, it is obvious that the manufacturing method according to the fourth preferred embodiment involves no increase in the number of manufacturing steps, as compared with the background art method of manufacturing the semiconductor memory device.

According to the fourth preferred embodiment, the dummy gate electrodes 20 are disposed in the X direction on the opposite sides of the active region 2 as viewed in plan. Thus, if the mask misalignment occurs in the X direction during the formation of the gate electrodes 3, 4a, 4b and the dummy gate electrodes 20, the widths of the two N⁺ source/drain regions 9a and 9b shown in FIG. 16B are held constant. This prevents the imbalance in conductance between the two access transistors of the SRAM cell to suppress the degradation of the stability of the SRAM operation, as in the second preferred embodiment.

The position and shape of the dummy gate electrodes 20 according to the fourth preferred embodiment are not limited to those shown in FIGS. 16A and 16B. A change may be made in the position and shape of the dummy gate electrodes 20 to produce any change in the resistance between the sources of the access transistors and the storage node, that is, change in the current driving capability and the conductance of the access transistors.

The dummy gate electrodes 20 may be positioned to cover the future source/drain regions of the driver transistors, thereby changing the current driving capability and the conductance of the driver transistors. Thus, any conductance ratio may be obtained without influences upon the gate length and the gate width of the access and driver transistors.

The dummy gate electrodes 20 may be connected to the access transistor gate electrode 3 or the driver transistor gate electrodes 4a, 4b. This reduces space on the substrate for the formation of the dummy gate electrodes 20 to contribute to the size reduction of the semiconductor memory device.

Figure 18A:
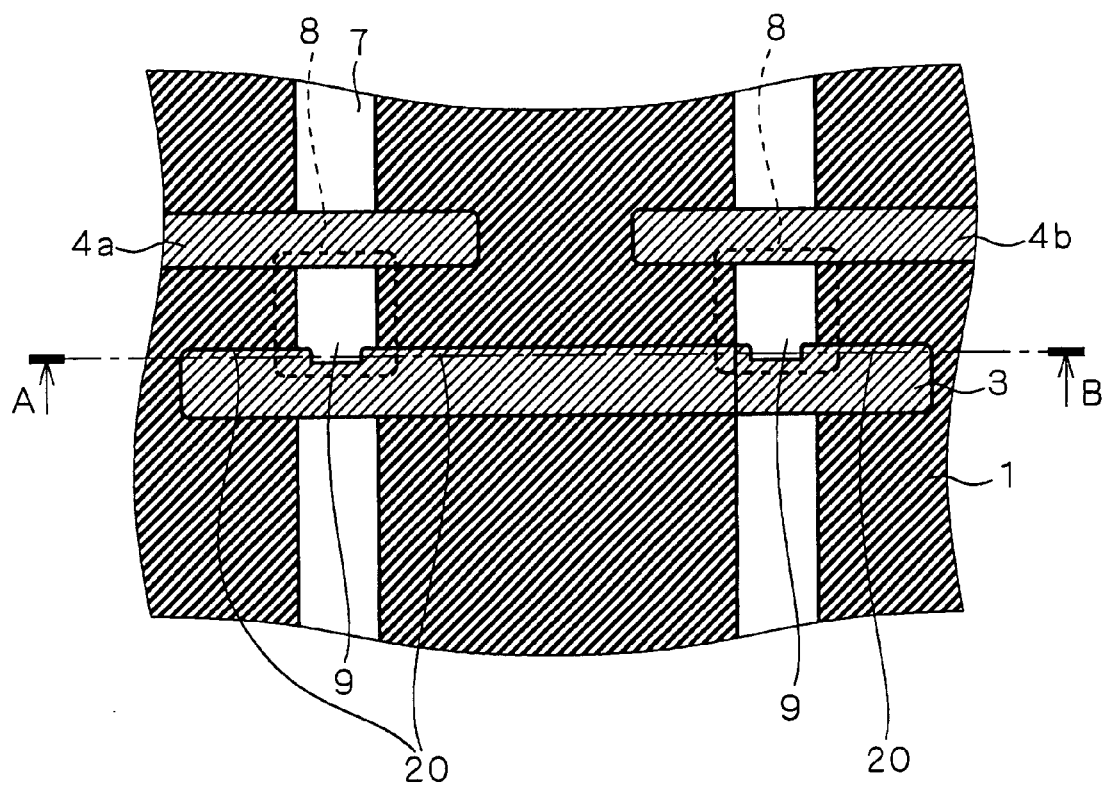
Figure 18B:
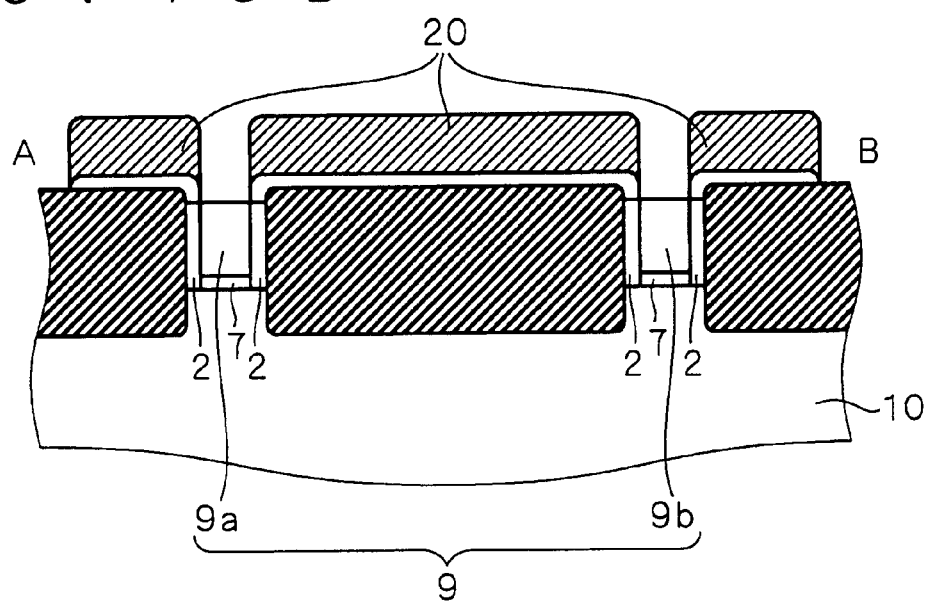
Figure 19:
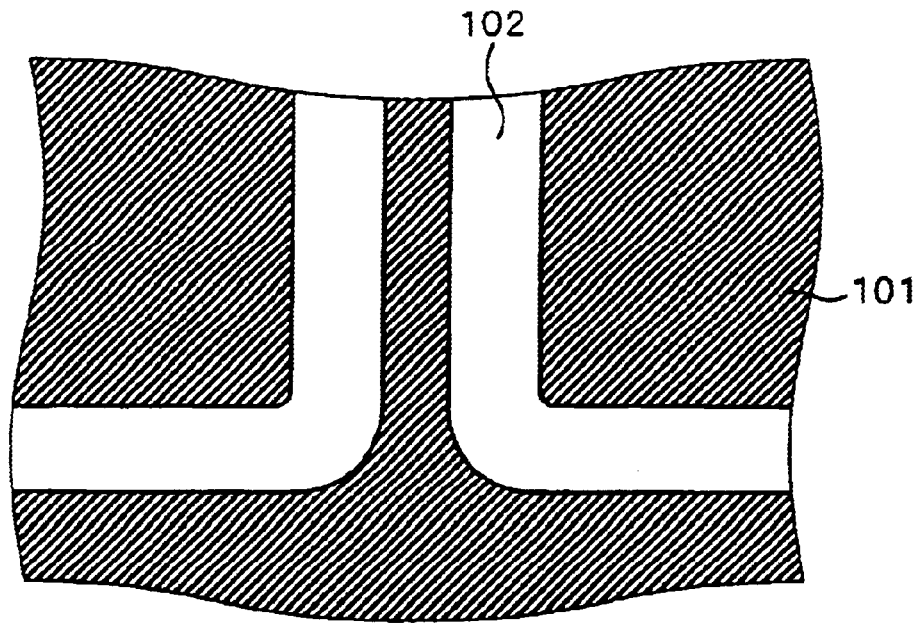
FIGS. 19, 20, 21A and 21B are views for illustrating background art manufacturing steps of an SRAM memory cell portion of a semiconductor memory device.
Figure 20:
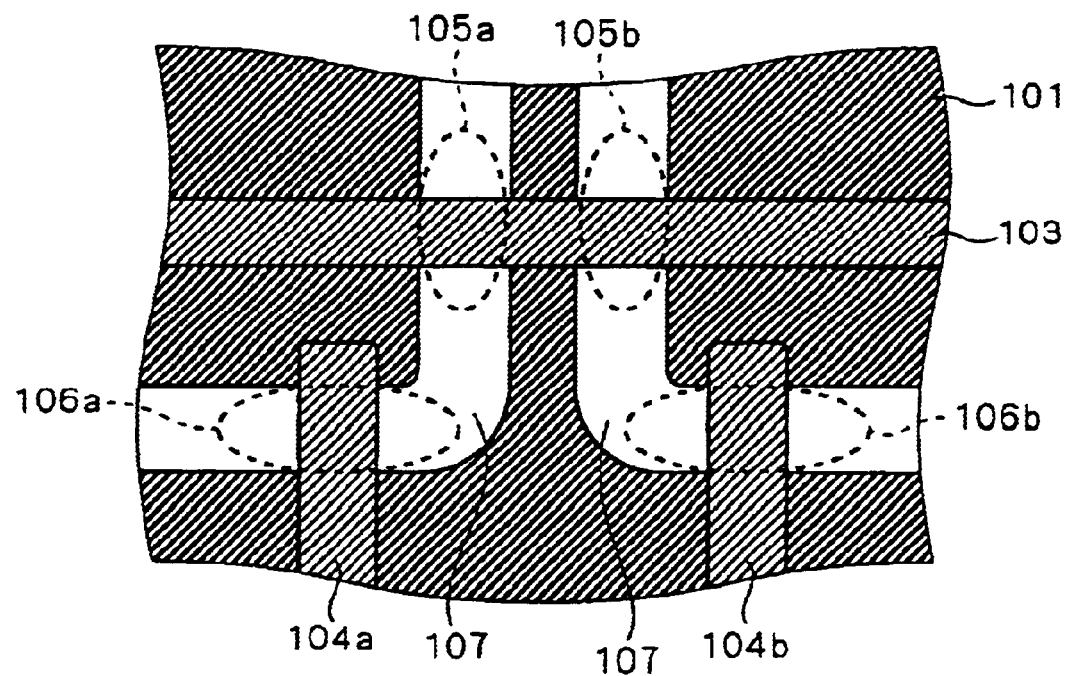
Figure 21A:
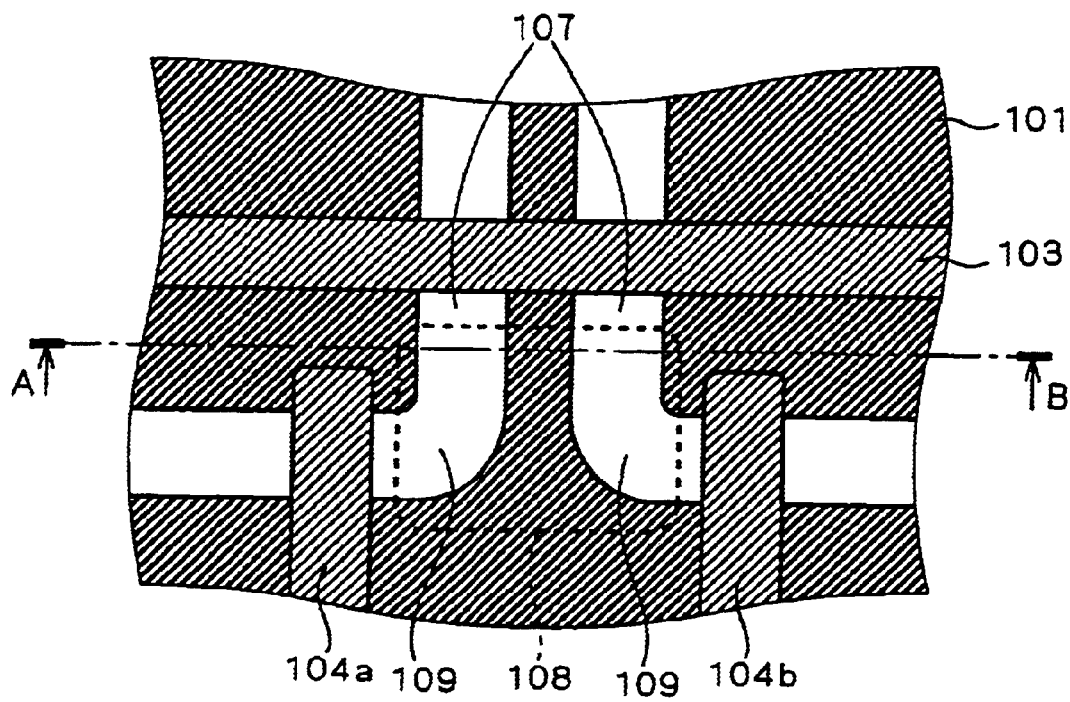
Figure 21B:
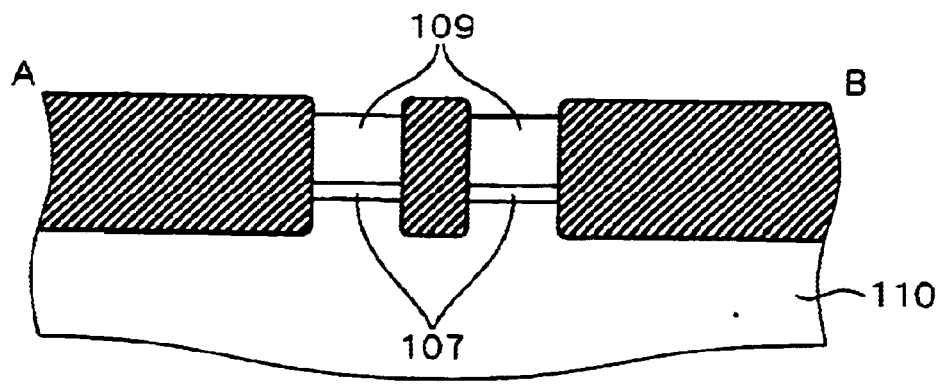

Examples of such modifications are shown in FIGS. 17A, 17B, 18A and 18B. Elements similar in function to those of FIGS. 1A and 1B are designated by the same reference numerals and characters. FIGS. 17A and 18A are top views, and FIGS. 17B and 18B are sectional views taken along the lines A–B of FIGS. 17A and 18A, respectively. It will be found from FIGS. 17B and 18B that the $N^+$ source/drain regions 9 and the $N^-$ source/drain regions 7 are not formed under the dummy gate electrodes 20. A change may be made in the position and shape of the dummy gate electrodes 20 to attain any conductance ratio.

While the invention has been described in detail, the foregoing description is in all aspects illustrative and not restrictive. It is understood that numerous other modifications and variations can be devised without departing from the scope of the invention.

What is claimed is:

1. A semiconductor memory device comprising
   a plurality of SRAM (Static Random Access Memory) cells each including:
   a driver transistor constituting a flip-flop circuit, said driver transistor having source/drain diffusion layers formed in an active region, and a gate electrode covering part of said active region;
   an access transistor for switching, said access transistor having source/drain diffusion layers formed in said active region, and a gate electrode covering part of said active region; and
   at least one dummy gate electrode for covering part of said active region so as to reduce a width of the source/drain diffusion layers,
   wherein said source/drain diffusion layers are formed in only other than said part of said active region covered with said at least one dummy gate electrode.

2. The semiconductor memory device according to claim 1, wherein
   said at least one dummy gate electrode includes a plurality of dummy gate electrodes, and
   said plurality of dummy gate electrodes are disposed on opposite sides of said active region as viewed in plan.

3. The semiconductor memory device according to claim 1, wherein
   said dummy gate electrode is connected to one of said gate electrode of said driver transistor and said gate electrode of said access transistor.

4. The semiconductor memory device according to claim 1, wherein
   said at least one dummy gate electrode includes a plurality of dummy gate electrodes, and
   at least one of said plurality of dummy gate electrodes is connected to one of said gate electrode of said driver transistor and said gate electrode of said access transistor.

* * * * *